(12) United States Patent
Koya et al.

(10) Patent No.: US 8,310,872 B2
(45) Date of Patent: Nov. 13, 2012

(54) MULTI-PAGE PARALLEL PROGRAM FLASH MEMORY

(75) Inventors: Yoshihito Koya, Tokyo (JP); Gary B. Bronner, Los Altos, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 171 days.

(21) Appl. No.: 12/863,409

(22) PCT Filed: Jan. 16, 2009

(86) PCT No.: PCT/US2009/031191
§ 371 (c)(1),
(2), (4) Date: Jul. 16, 2010

(87) PCT Pub. No.: WO2009/094298
PCT Pub. Date: Jul. 30, 2009

(65) Prior Publication Data
US 2010/0290286 A1  Nov. 18, 2010

Related U.S. Application Data

(60) Provisional application No. 61/023,798, filed on Jan. 25, 2008.

(51) Int. Cl.
*G11C 16/04* (2006.01)
(52) U.S. Cl. ......... 365/185.09; 365/185.17; 365/189.05; 365/189.06

(58) Field of Classification Search ............ 365/185.08, 365/185.17, 189.06, 189.05
See application file for complete search history.

(56) References Cited

U.S. PATENT DOCUMENTS

| | | | | |
|---|---|---|---|---|
| 5,602,987 A | 2/1997 | Harari et al. | ............. | 395/182.06 |
| 7,023,741 B2* | 4/2006 | Nakamura et al. | ....... | 365/189.04 |
| 7,400,534 B2* | 7/2008 | Maejima | ................... | 365/185.17 |
| 7,802,064 B2* | 9/2010 | Kim | ............................... | 711/157 |
| 2005/0276108 A1 | 12/2005 | Guterman | ................ | 365/185.18 |
| 2006/0203587 A1 | 9/2006 | Li et al. | ........................ | 365/207 |

FOREIGN PATENT DOCUMENTS

WO  WO 2005/112039  11/2005

OTHER PUBLICATIONS

International Preliminary Report on Patentability (Chapter I of the Patent Cooperation Treaty) Including Written Opinion, with mail date of Aug. 5, 2010, for International Application No. PCT/US2009/031191. 8 pages.

* cited by examiner

*Primary Examiner* — VanThu Nguyen
(74) *Attorney, Agent, or Firm* — Mahamedi Paradice Kreisman LLP; Lance M. Kreisman (57) ABSTRACT

A NAND flash memory device having a bit line and a plurality of storage cells coupled thereto. Programming circuitry is coupled to the plurality of storage cells concurrently to program two or more of the storage cells in different NAND strings associated with the same bit line.

13 Claims, 11 Drawing Sheets

FIG. 1A

PRIOR ART

MULTI-PAGE PARALLEL PROGRAM FLASH MEMORY

CROSS-REFERENCE TO RELATED APPLICATIONS/TECHNICAL FIELD

Pursuant to 35 U.S.C. §365, this application claims priority from International Application No. PCT/US2009/031191, published as WO 2009/094298 A1 on Jul. 30, 2009, which claims priority from U.S. Provisional Application No. 61/023,798, filed Jan. 25, 2008 and entitled "Multi-Page Parallel Program Flash Memory". International Application No. PCT/US2009/031191 and U.S. Provisional Application No. 61/023,798 are hereby incorporated by reference in their entirety.

The disclosure herein relates to non-volatile flash memory systems generally and more specifically to data communication speeds of such systems.

BACKGROUND

Flash memory, which is a form of non-volatile memory, has become an increasingly popular means of electronic data storage. Flash memory is particularly advantageous to traditional magnetic forms of memory storage, as it is more durable and allows for faster data accesses. In a standard flash memory, data is stored across a plurality of floating-gate transistors, known as "cells", typically in large blocks. Each cell functions like a standard metal-oxide-semiconductor field-effect transistor (MOSFET) with the exception of a second ("floating") gate, electrically isolated between the standard control gate and the MOSFET channel, acting in a capacitive capacity for storing electric charge thereon. Accordingly, each cell is capable of storing a single bit, or multiple bits, of data based on the charge of the floating gate. For example, an uncharged floating gate may correspond to logic "1" bit of data, while a sufficiently (negative) charged floating gate may correspond to logic "0" bit of data. Cells are typically initialized (and reset) to a logic "1" state (i.e. no negative charge is initially stored on the floating gate), and may be subsequently programmed (i.e. written) to a logic "0" state. To the contrary, individual cells (within a block) may not be independently reset from a logic "0" state back to a logic "1" state, due to flash memory architecture constraints. In other words, large blocks of cells are generally erased all at once.

Flash memory is typically found in two different varieties: NOR and NAND. The main difference between NOR and NAND flash memories lies in the configuration of the cells. Cells of a NOR memory are coupled to a bit line in parallel, thus allowing individual access to each of the cells. On the other hand, cells of a NAND memory are coupled to a bit line in series, thus operations are typically performed across the entire series of cells coupled to the bit line at a time. However, the series configuration of cells allows for the cells to be placed in closer proximity to one another, resulting in more densely packed memory arrays. This makes NAND memory advantageous by utilizing smaller die area for greater data storage capacity. However, up until now the way in which data is programmed, within a NAND flash memory, has severely limited the speed and efficacy at which program operations may be performed, thus limiting the use of NAND memory primarily to mass-storage devices. At the same time, the increasing use of NAND flash memory in portable electronic applications such as laptop computers and digital cameras has necessitated faster program speeds (e.g. video recording).

Figure 1A:
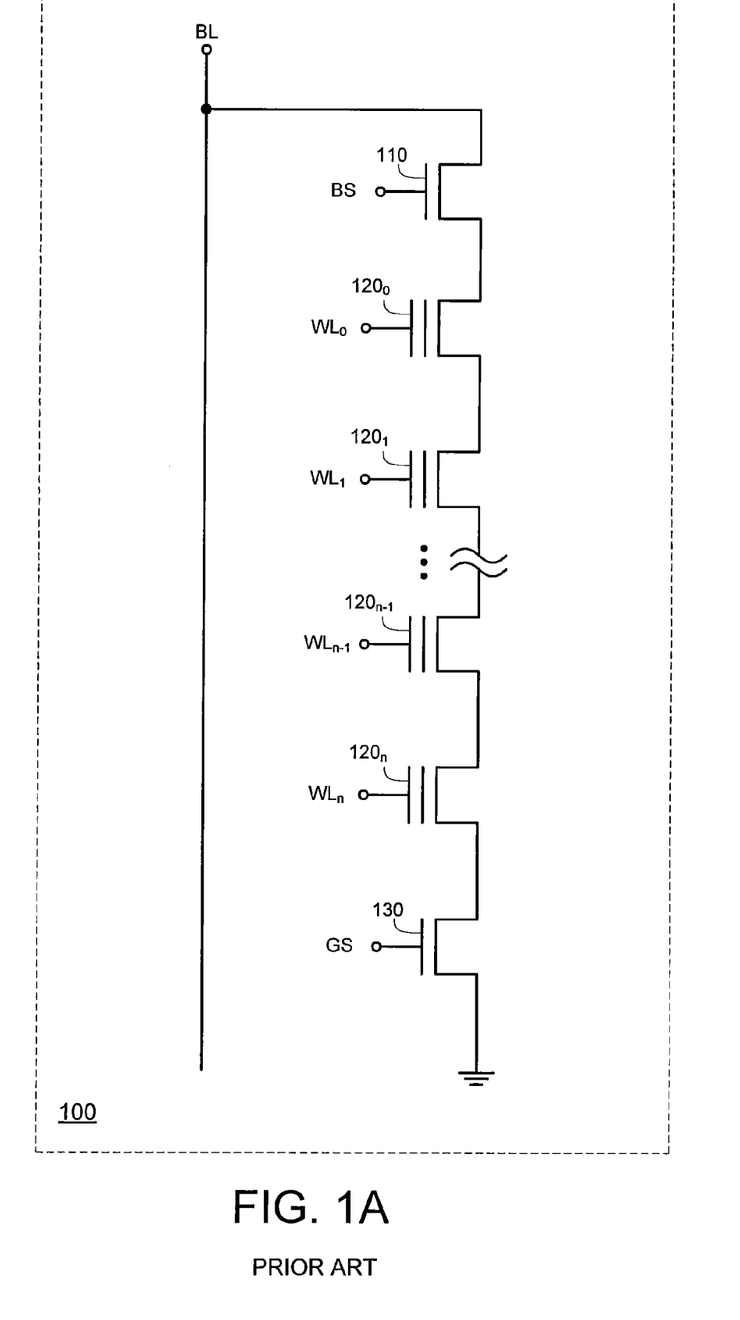
FIG. 1A illustrates a prior-art NAND flash memory.

FIG. 1A illustrates a prior-art NAND memory device 100, made up of a bit line BL coupled to a plurality of cells $120_0$-$120_n$ (for purposes of discussion, it is assumed that each of the cells $120_0$-$120_n$ is a floating-gate transistor modeled after an NMOS). A bit line select transistor 110 is coupled between the bit line BL and the first cell $120_0$, and a ground select transistor 130 is coupled between the last cell $120_n$ and a source terminal (e.g. a ground potential). Data is programmed into the memory device 100, one cell at a time, by applying a high program voltage $V_{PGM}$ to the word line for the desired cell, and applying a pass voltage $V_{PASS}$ to the word lines of all of the remaining cells. For example, programming a bit of data into the cell $120_1$ requires first lowering the bit line BL to a low voltage (~0V). The word line $WL_1$ is then raised to a suitable program voltage $V_{PGM}$ (~20V) while the remaining word lines $WL_0$ and $WL_2$-$WL_n$ are brought to a pass voltage $V_{PASS}$ (~10V). Next, a high voltage $V_{CC}$ is applied to the bit select line BS which effectively "turns on" the bit select transistor 110, while a low voltage (~0V) is applied to the ground select line GS which effectively "turns off" the ground select transistor 130. Accordingly, the pass voltage applied to the word lines $WL_0$ and $WL_2$-$WL_n$ are sufficiently above a threshold voltage $V_T$ to allow the respective cells $120_0$ and $120_2$-$120_n$ to conduct, regardless of any stored charge on their floating gates, thus allowing the high program voltage applied to the gate of cell $120_1$ to induce electron tunneling onto the floating gate of the cell $120_1$. An unfortunate constraint of this approach is that only one of the cells $120_0$-$120_n$ coupled to the bit line BL may be programmed at a time. In other words, each row (e.g., group of one or more cells each coupled to the same word line WL, often referred to as a "page") of cells $120_0$-$120_n$ is typically programmed sequentially. It should be noted that, for purposes of discussion, only a single bit line is shown with respect to the memory device 100 of FIG. 1A. However, the NAND memory device 100 may have two or more bit lines BL displaced substantially parallel to one another, such that the bit lines 13L and the word lines $WL_0$-$WL_n$ are each coupled to an array of memory cells.

Still referring to FIG. 1A, data may be read from the NAND flash memory device 100, one cell at a time, by applying a low read voltage $V_{RD}$ to the word line for the desired cell and applying the pass voltage $V_{PASS}$ to all of the remaining cells. Continuing from the previous example, in order to read out the data stored in the cell $120_1$, the bit line BL is first charged to a voltage $V_{BL}$. The word line $WL_1$ is then brought to a read voltage $V_{RD}$ while the remaining word lines $WL_0$ and $WL_2$-$WL_n$ are once again brought to the pass voltage $V_{PASS}$(~10V). Now when the bit line select transistor 110 and the ground select transistor 130 are turned on, the negatively stored charge on the floating gate of cell $120_1$ effectively raises the threshold voltage $V_T$ of cell $120_1$ above the read voltage $V_{RD}$, thus maintaining the cell $120_1$ in a non-conducting state. Accordingly, the charge on the bit line BL remains at the voltage $V_{BL}$, and may be sensed and interpreted as a logical "0" bit of data. Alternatively, the presence of charge on the bit line BL may be sensed and interpreted as a logical "1" bit of data. On the other hand, if no charge was stored on the floating gate of cell $120_1$ (representing a logical 1 bit of data), then the application of the read voltage $V_{RD}$ may sufficiently induce cell $120_1$ into a conducting state thus forming a path to ground. In such case, the charge on the bit line BL is pulled low, and may be sensed and interpreted as a logical "1" bit of data. Alternatively, the absence of charge on the bit line BL may be sensed and interpreted as a logical "0" bit of data.

Figure 1B:
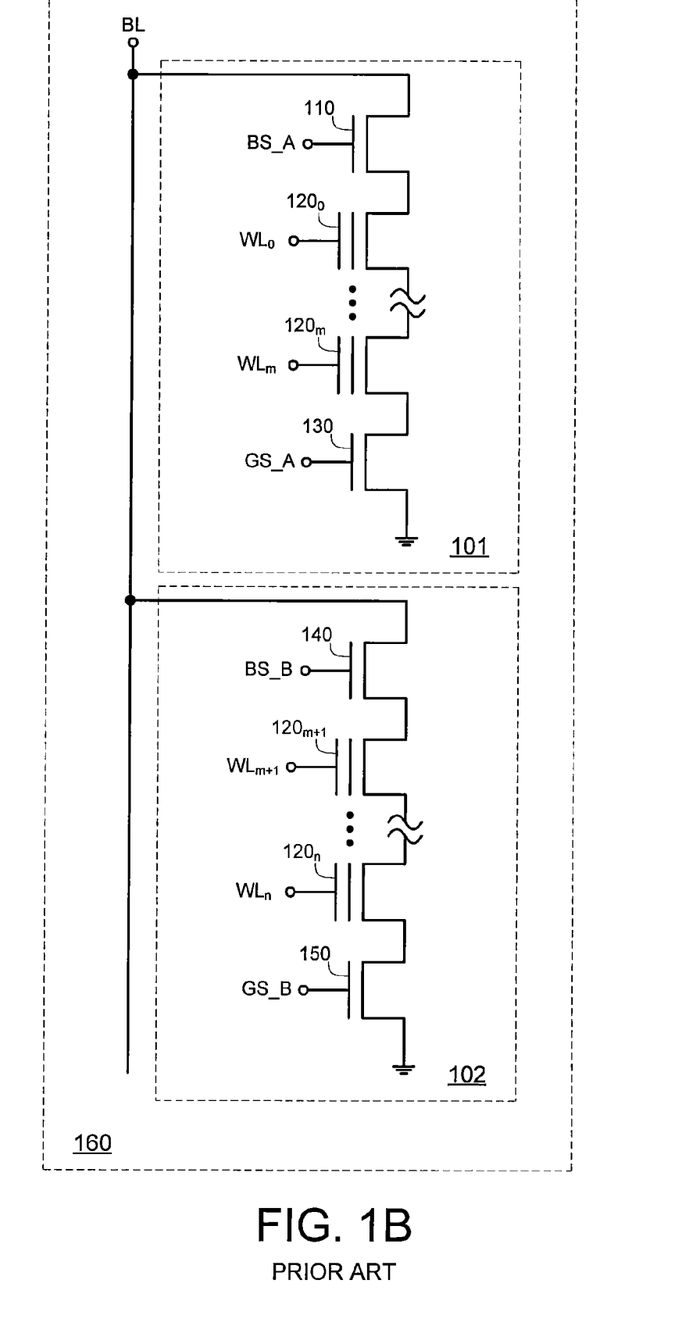
FIG. 1B illustrates another prior-art NAND flash memory.

FIG. 1B illustrates another prior-art NAND memory device 160 made up of multiple NAND memory chains 101 and 102. Memory chain 101 is made up of a bit select transistor 110, a first plurality of cells $120_0$-$120_m$, and a ground select transistor. Memory chain 102 is made up of a bit select transistor 140, a second plurality of cells $120_{m+1}$-$120_n$, and a ground select transistor 150. The operation of NAND memory device 160 is very similar to that of the NAND memory device 100, as described above in reference to FIG. 1A, with the exception that the two memory chains 101 and 102 may be operated on separately. For example, turning on bit select transistor 110, while leaving bit select transistor 140 off, allows for programming to occur only within the cells $120_0$-$120_m$. This allows more cells to be coupled to the bit line BL while, at the same time, reducing power consumption. It is important to note that, individually, each of the memory chains 101 and 102 operates exactly the same as the memory device 100, of FIG. 1A.

It is also important to note that programming is generally completed on a first one of the cells $120_0$-$120_n$ before programming may begin on a second one of the cells $120_0$-$120_n$, to ensure accurate programming of data. Thus, a programming operation still requires turning on exactly one of the bit select transistors 110 or 140, and applying a program voltage $V_{PGM}$ to exactly one of the world lines $WL_0$-$WL_n$. For example, a programming of cell $120_0$ would require first lowering the voltage of the bit line BL (~0V). Next, bit select transistor 110 is turned on by raising the voltage on the bit select line BS_A to a voltage VCC, at the same time bit select transistor 140 is held off by applying a low voltage (~0V) to the bit select line BS_B. A program voltage $V_{PGM}$ is then applied to the word line $WL_0$, while a pass voltage is applied to all of the remaining word lines $WL_1$-$WL_n$. During this programming operation, both ground select transistors 130 and 150 are held in the "off" state. Similarly, read operations may be performed in the manner discussed above in reference to FIG. 1A.

Figure 1C:
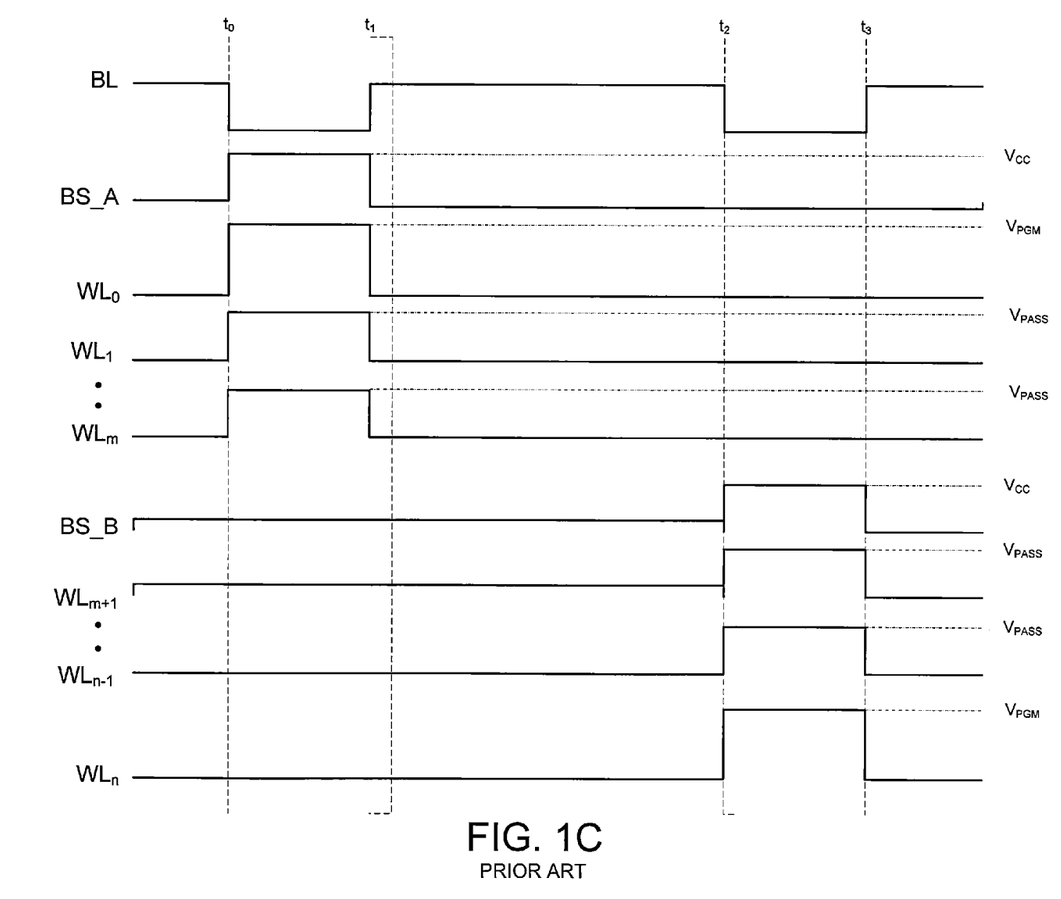
FIG. 1C illustrates a timing diagram for program operation within a NAND flash memory.

FIG. 1C illustrates a timing diagram for a program operation within a NAND flash memory. The program operation of FIG. 1C is herein discussed in reference to the memory device 160 of FIG. 1B. At time $t_0$ the bit line BL is brought low. At this time the first bit select line BS_A is set to a voltage $V_{CC}$ and the word line $WL_0$ is set to a voltage $V_{PGM}$, while the word lines $WL_1$-$WL_m$ are set to a voltage $V_{PASS}$ and the second bit select line BS_B and the remaining word lines $WL_{m+1}$-$WL_n$ remain deasserted (for purposes of discussion, when referring to the signal levels on the word lines $WL_0$-$WL_n$, application of a program voltage $V_{PGM}$ is represented as an "asserted" signal, application of a pass voltage $V_{PASS}$ is represented as an "asserted but non-programming" signal, and application of a zero voltage is represented as a "deasserted" signal). The word line $WL_0$ remains asserted for the duration of time $t_0$ to $t_1$ needed to program data into cell $120_0$, and the first bit select line BS_A also remains asserted for this entire duration, as discussed above in reference to FIGS. 1A and 1B. At time $t_1$, after the program operation in cell $120_0$ has completed, the first bit select line BS_A and the word lines $WL_0$-$WL_m$ are deasserted, allowing the bit line BL to return to a non-programming state.

Then at time $t_2$, the bit line is once again brought low. At this time the second bit select line BS_B is set to the voltage $V_{CC}$, the word line $WL_n$ is set to the voltage $V_{PGM}$, and the word lines $WL_{m+1}$-$WL_{n-1}$ are set to the voltage $V_{PASS}$. During this time the first bit select line BS_A and all other word lines $WL_0$-$WL_m$ remain deasserted. The word line $WL_n$ remains asserted for the duration of time $t_2$ to $t_3$ needed to program data into cell $120_0$, and the first bit select line BS_A also remains asserted for this entire duration. It should also be noted that, although not shown in the illustration of FIG. 1C, the ground select lines GS_A and GS_B are constantly held low during the program operations.

The sequence of program operations in the example above may take a long time to complete, as a second program operation generally begins only after a first program operation is fully completed (i.e. only one of the word lines $WL_0$-WLn may be asserted at any given time).

Figure 2:
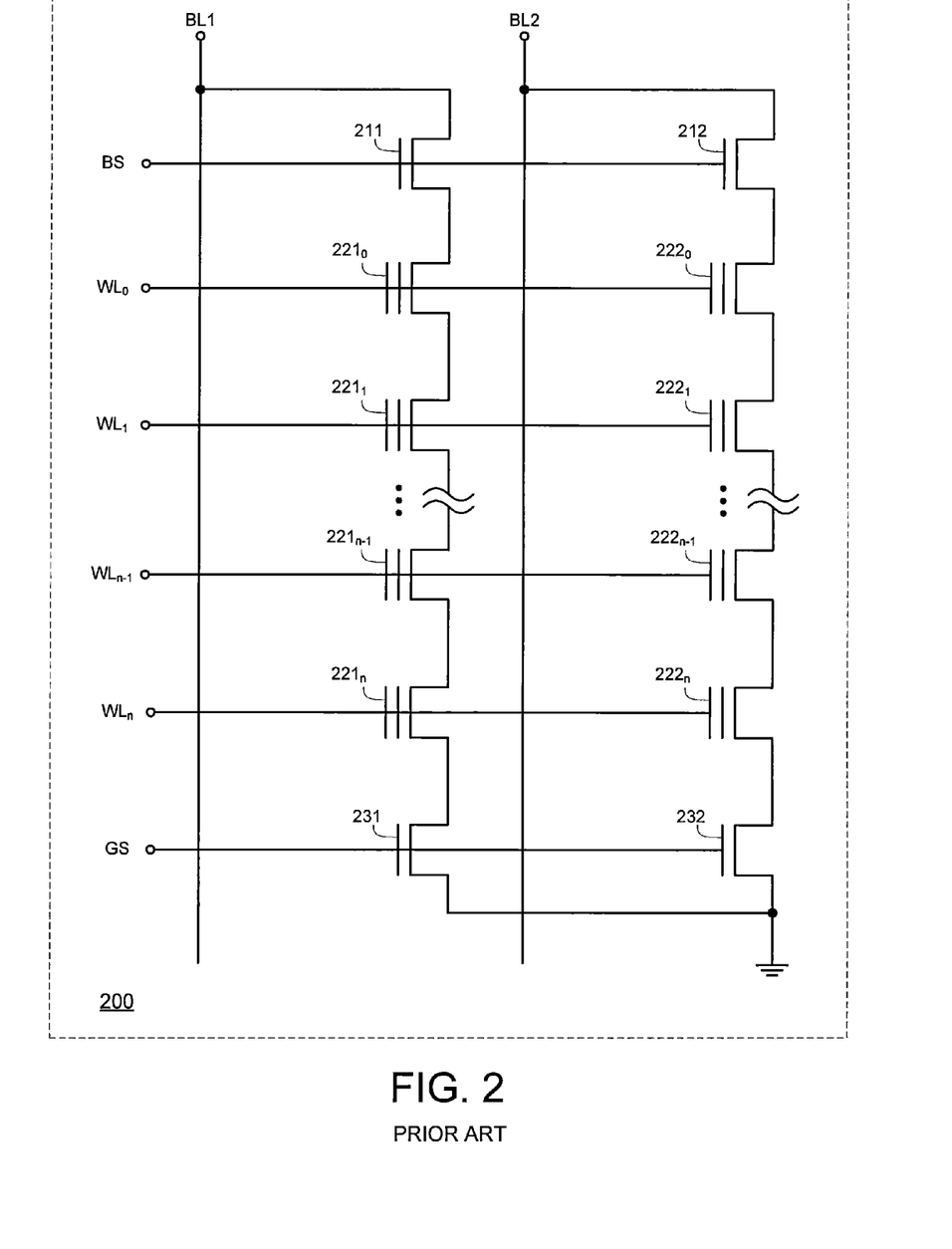
FIG. 2 illustrates another prior-art NAND flash memory.

FIG. 2 illustrates another prior-art NAND memory device 200 made up of an array of cells $221_0$-$221_n$ and $222_0$-$222_n$, two bit lines BL1 and BL2 each coupled to a respective column of cells, via bit select transistors 211 and 212 and ground select transistors 231 and 232, and a plurality of word lines $WL_0$-$WL_n$ each coupled to a respective row of cells. Note that, in FIG. 2, a voltage applied to any particular one of the word lines $WL_0$-$WL_n$ is received at the gates of two cells. For example, a program voltage $V_{PGM}$ applied to the word line $WL_1$ places both cells $221_1$ and $222_1$ in a program state. In order to prevent an accidental programming of cell $222_1$ when programming cell $221_1$, the bit line BL2 should first be charged to a high voltage $V_{CC}$. When the bit select transistor 212 is turned on, while the ground select transistor remains off, the current from the bit line BL2 creates a channel (~7V) across each of the cells $222_0$-$222_n$. The voltage difference is small enough to prevent electrons from tunneling into the floating gates of any of the cells $222_0$-$222_n$, regardless of the voltages ($V_{PASS}$ or $V_{PGM}$) applied to the respective word lines $WL_0$-$WL_n$. However, this places a further constraint on the programming of a NAND flash memory device 200, as the cells, coupled to separate word lines $WL_0$-$WL_n$, of separate bit lines BL1 and BL2 are also programmed one at a time. In other words, only one of the word lines $WL_0$-$WL_n$ may be set to a program voltage $V_{PGM}$, at any given time, across the entire array of cells $221_0$-$221_n$, and $222_0$-$222_n$. Accordingly, there exists a need for NAND flash memory devices with faster program speeds.

BRIEF DESCRIPTION OF THE DRAWINGS

The disclosure herein is illustrated by way of example, and not by way of limitation, in the figures of the accompanying drawings and in which like reference numerals refer to similar elements and in which.

DETAILED DESCRIPTION

In embodiments disclosed herein, a NAND flash memory device is disclosed which can perform concurrent programming operations at a fine granularity to multiple pages of cells with limited die area penalty and small external random access memory (RAM) overhead. For purposes of discussion, it should be noted that the words "program" and "write" may be used interchangeably. Also for purposes of discussion, the words "row" and "page" may be used interchangeably.

Figure 3A:
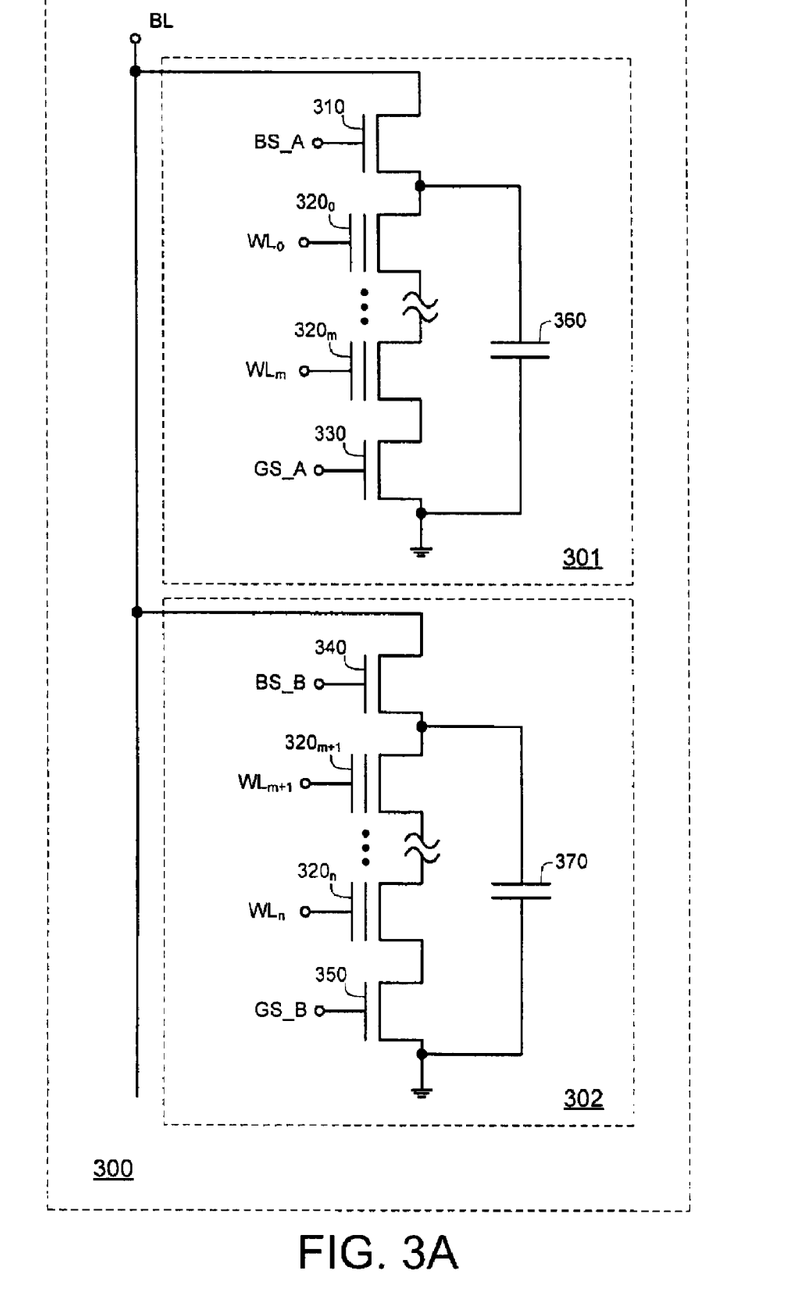
FIG. 3A illustrates a memory device according to an embodiment.

FIG. 3A illustrates a memory device 300 according to an embodiment. The memory device 300 includes a bit line BL coupled to two memory chains 301 and 302. Memory chain 301 is made up of a bit line select transistor 310, a first plurality of cells $320_0$-$320_m$, a ground select transistor 330, and a capacitive storage element 360. Memory chain 302 is made up of a bit line select transistor 340, a second plurality of cells $320_{m+1}$-$320_n$, a ground select transistor 350, and a capacitive storage element 370. Operation of memory device 300 is similar to that of memory device 160, of FIG. 1B, with the exception that both memory chains 301 and 302 may be programmed concurrently. More specifically, a programming of one of cells $320_0$-$320_m$ may overlap in time with a programming of one of the cells $320_{m+1}$-$320_n$.

For example, suppose two program operations are to be performed, concurrently, on cell $320_0$ of memory chain 301 and cell $320_n$ of memory chain 302. This may be done by first applying a low voltage on the bit line BL (~0V) and then turning on the bit line select transistor 310, while applying a program voltage $V_{PGM}$ to the word line $WL_0$ and a pass voltage $V_{PASS}$ to each of the word lines $WL_1$-$WL_m$. Because the electron tunneling process for drawing charge onto the floating gate of the cell $320_0$ is slow (~300 µs), the voltage on the bit line BL may be temporarily stored across the capacitive storage element 360. This allows the program operation to continue even with the bit select transistor 310 turned off. Decoupling the memory chain 301 from the bit line BL in such a manner allows for a second program operation to take place within the memory chain 302, without affecting the first program operation still taking place within memory chain 301. Since program operations may take place within cells $320_0$ and $320_n$ at the same time, the respective word lines $WL_0$ and $WL_n$ may be concurrently held at a program voltage $V_{PGM}$. In alternative embodiments, the capacitive storage elements 360 and 370 may be implemented using a parasitic capacitance (e.g. channel capacitance) of the memory chains 301 and 302, respectively, thus eliminating the need for any additional circuit elements.

Because program information is stored temporarily on the capacitive storage elements 360 and 370, an uninterrupted write refresh cycle may be performed directly from the capacitive storage elements 360 and 370 rather than an external RAM (e.g. refreshing the data programmed into the cells $320_0$ and $320_n$). This way, the write refresh cycle will not interrupt any write cycle that may currently be taking place. In alternative embodiments program data may still be refreshed from the external RAM. For example, this may be desirable if the capacitance of the capacitive storage elements 360 and 370 does not satisfy a program time constraint.

Still referring to the embodiment of FIG. 3A, it is important to note that data may be read from the memory device 300 in a conventional manner, as discussed above in reference to FIGS. 1A and 1B. It should also be noted that any number of concurrent program operations may occur within the cells of memory device 300, depending on the total number of memory chains within the memory device 300. For example, if the memory device 300 has X number of memory chains, then it is possible to program X number of cells concurrently.

Figure 3B:
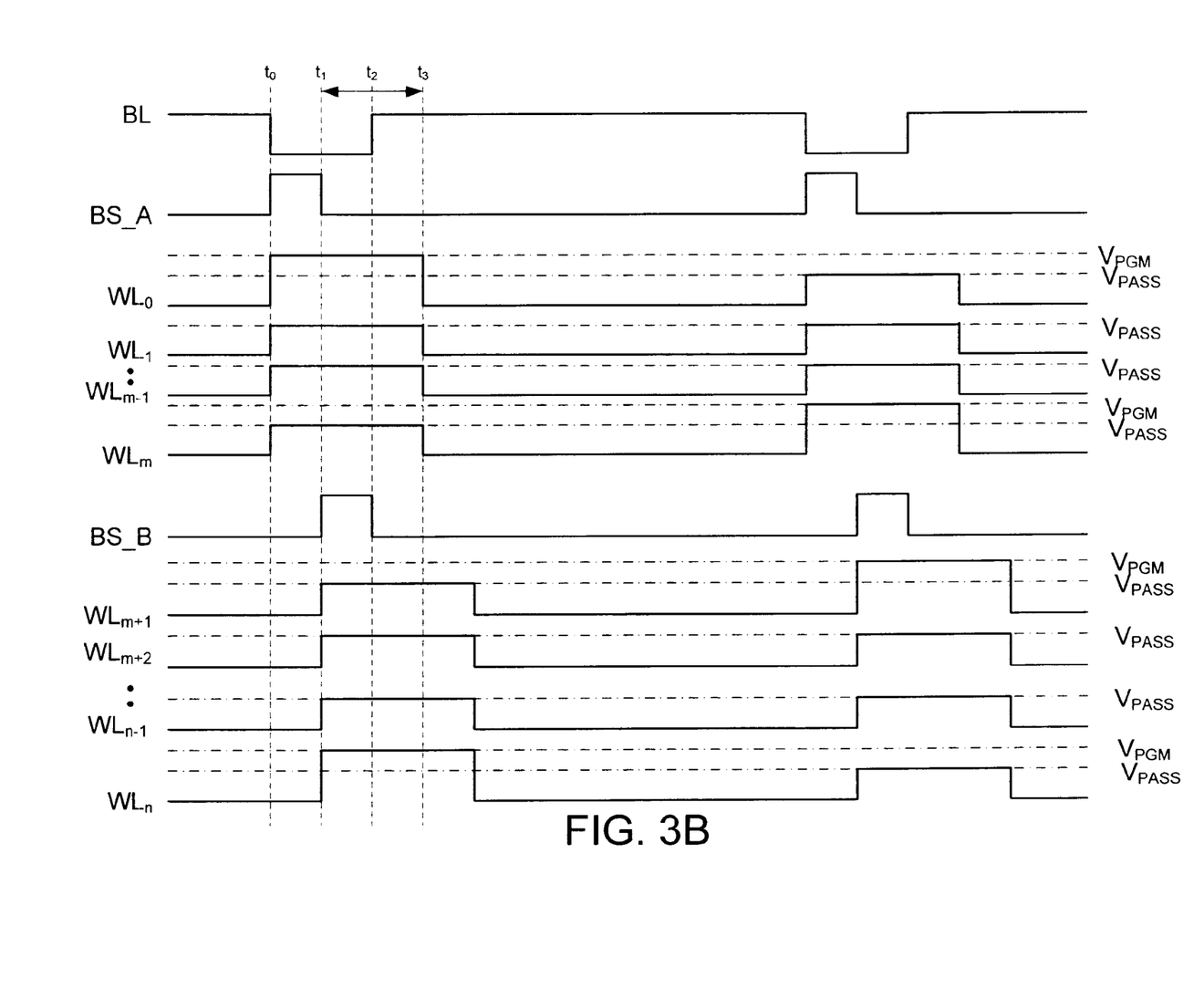
FIG. 3B illustrates a timing diagram for a program operation according to an embodiment.

FIG. 3B illustrates a timing diagram for a program operation, according to an embodiment. The program operation of FIG. 3B is herein discussed in reference to the memory device 300 of FIG. 3A. At time $t_0$ the bit line BL is brought low. Also during this time the first bit select line BS_A and the word line $WL_0$ are both asserted, while word lines $WL_1$-$WL_m$ are set to voltage $V_{PASS}$ and the second bit select line BS_B and all other word lines $WL_{m+1}$-$WL_n$ remain deasserted (for purposes of discussion, when referring to the signal levels on the word lines $WL_0$-$WL_n$, application of a program voltage $V_{PGM}$ is represented as an "asserted" signal and application of a zero voltage is represented as a "deasserted" signal, and application of a voltage $V_{PASS}$ is represented as "asserted but non-programming" signal. The voltage $V_{PGM}$ can be applied to a single cell per single NAND chain during an assertion period). The first bit select line BS_A is deasserted at time $t_1$, after the capacitive storage element 360 has been charged to the appropriate voltage level, and the second bit select line BS_B and the word line $WL_n$ are both asserted at this time. Note that the word lines $WL_0$ and $WL_n$ are both asserted at time $t_1$, as electron tunneling takes place concurrently within the cells $320_0$ and $320_n$.

At time $t_2$ the second bit select line BS_B is deasserted, allowing the bit line BL to return to an original state. Both word lines $WL_0$ and $WL_n$ remain asserted during this time, as programming continues within the cells $320_0$ and $320_n$. $WL_1$-$WL_{n-1}$ are set to voltage $V_{PASS}$ during this time. At time $t_3$ the word lines $WL_0$-$WL_m$ are deasserted as the program operation is completed within the cell $320_0$. Thus, it should be noted that the word lines $WL_0$ and $WL_n$ are asserted concurrently for the entire duration between times $t_1$ and $t_3$. It should also be noted that, although not shown in the illustration of FIG. 3B, the ground select lines GS_A and GS_B are held low during the program operations.

Figure 4:
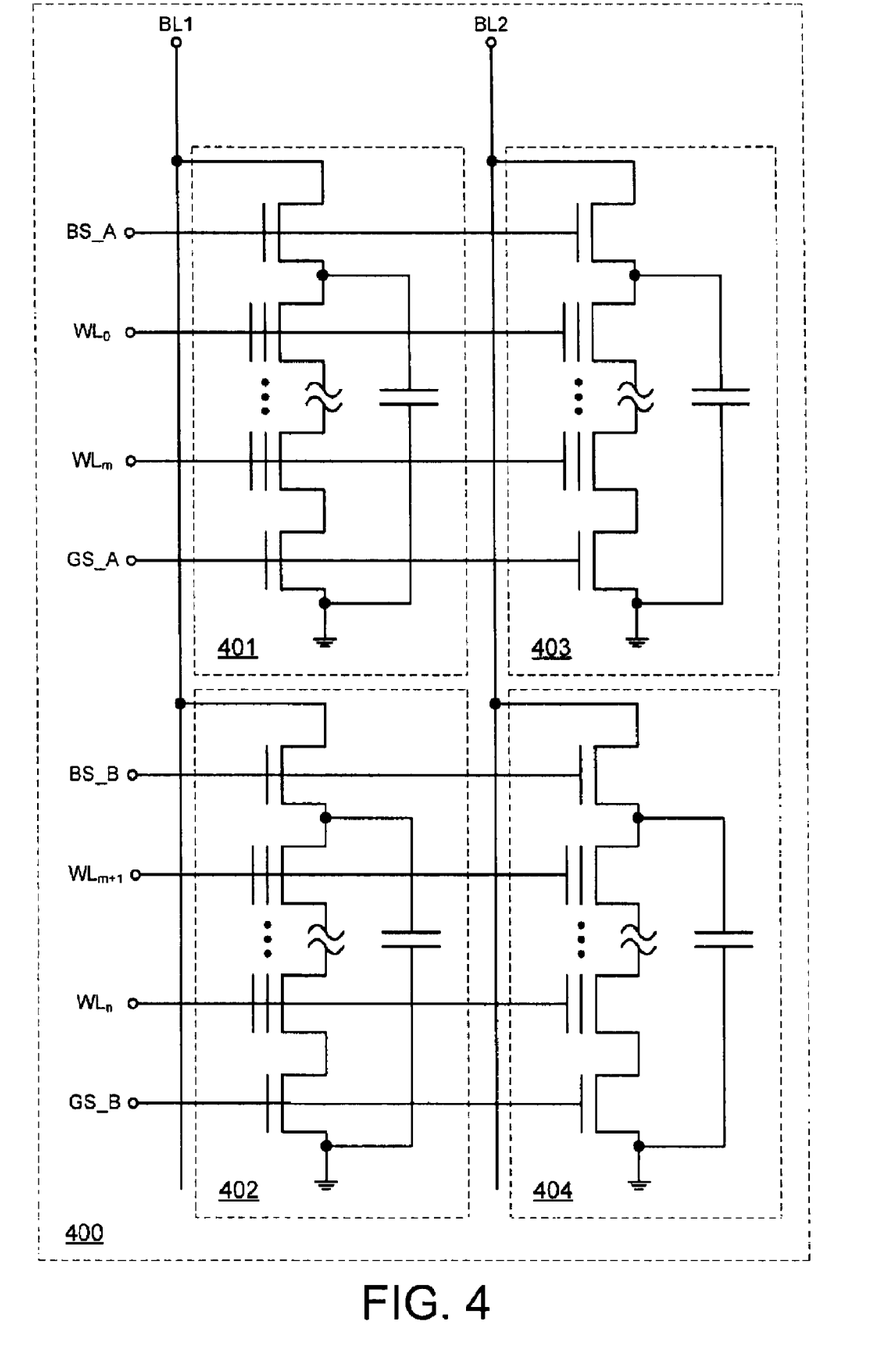
FIG. 4 illustrates a memory device according to another embodiment.

FIG. 4 illustrates a memory device according to another embodiment. Memory device 400 includes two bit lines BL1 and BL2 coupled to four memory chains 401-404. The embodiment of FIG. 4 allows for a program operation to occur in separate pages of each of the bit lines BL1 and BL2, concurrently. For example a first program operation may be performed within the memory chain 402 by applying a low voltage across the first bit line BL1 and applying a high voltage across the second bit line BL2. Thus, when a program voltage $V_{PGM}$ is applied to one of the word lines $WL_{m+1}$-$WL_n$, a bit may be programmed into a corresponding cell of memory chain 402 while all of the data stored within memory chain 404 remains unaffected. A low voltage is then applied across the bit select line BS_B to turn off respective bit line select transistors of both bit lines BL1 and BL2 that are coupled to the bit select line BS_B. Now a second program operation may be performed within the memory chain 403 by applying a low voltage across the second bit line BL2 and applying a high voltage across the first bit line BL1. This way, when a program voltage $V_{PGM}$ is applied to one of the word lines $WL_0$-$WL_n$, a bit may be programmed into a corresponding cell of memory chain 403 while all of the data stored within memory chain 401 remains unaffected. Thus, a second program operation may take place, concurrently, on the second bit line BL2 without affecting a first program operation already taking place in a different page on the first bit line BL1. In alternative embodiments, a plurality of memory chains may be coupled to each bit line segment of the segmented bit lines BL1 and BL2.

Figure 5:
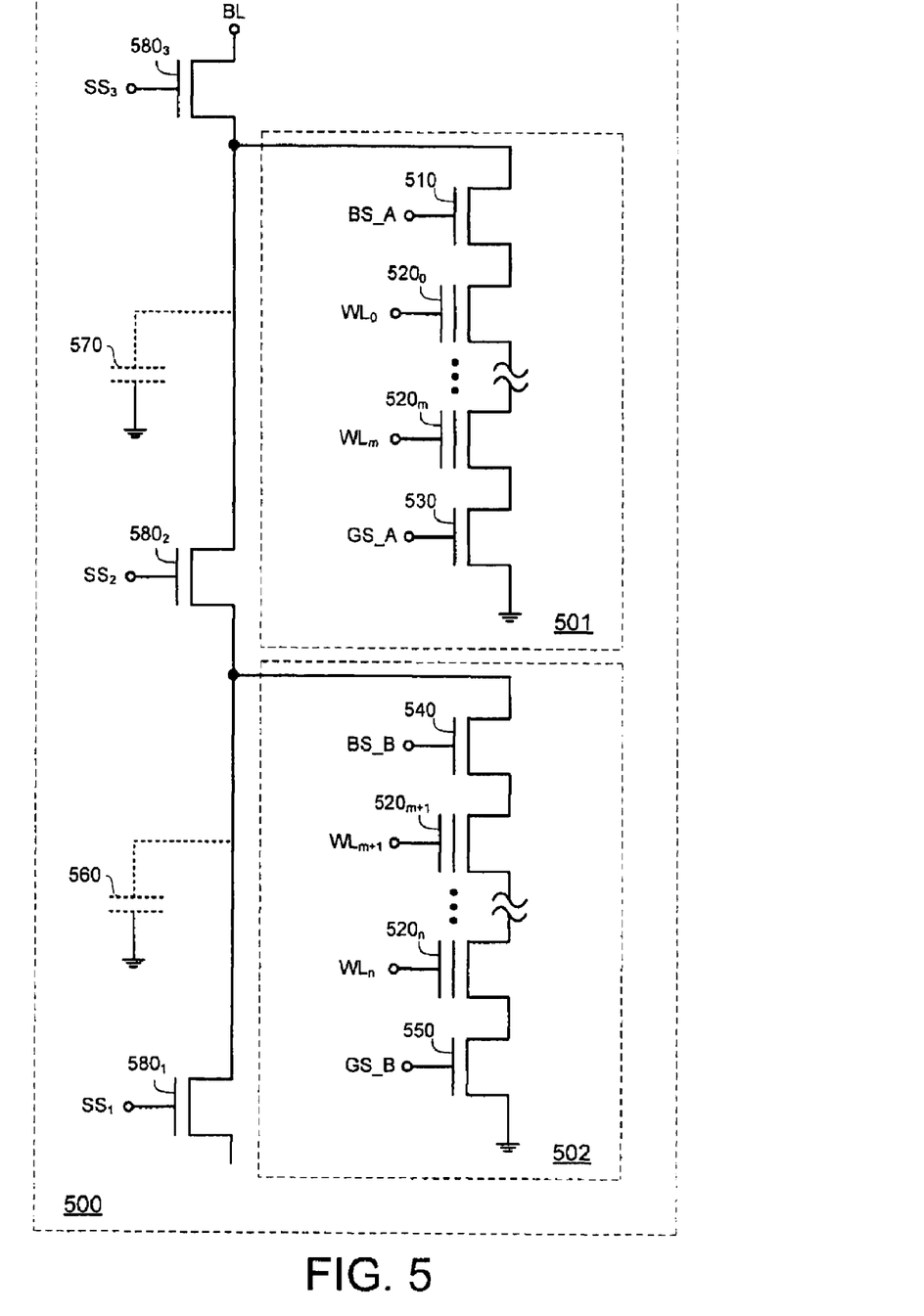
FIG. 5 illustrates a memory device according to yet another embodiment.

FIG. 5 illustrates a memory device according to yet another embodiment. The memory device 500 includes a segmented bit line BL coupled to two memory chains 501 and 502. Memory chain 501 is made up of a bit line select transistor 510, a first plurality of cells $520_0$-$520_m$, and a ground select transistor 530. Memory chain 502 is made up of a bit line select transistor 540, a second plurality of cells $520_{m+1}$-$520_n$, and a ground select transistor 550. A plurality of segmenting transistors $580_1$-$580_3$ are coupled in series along the segmented bit line BL, effectively separating the bit line BL into two bit line "segments". The circuit elements coupled between the segmenting transistors $580_1$ and $580_2$ form a first bit line segment, while the circuit elements coupled between the segmenting transistors $580_2$ and $580_3$ form a second bit line segment. For example, as illustrated in FIG. 5, the first bit line segment includes the memory chain 502 and the second bit line segment includes the memory chain 501. For purposes of discussion, only one memory chain is shown coupled to each of the bit line segments $580_1$-$580_2$ and $580_2$-$580_3$, however, in alternative embodiments a plurality of memory chains may be additionally coupled to each of the bit line segments $580_1$-$580_2$ and $580_2$-$580_3$. When programming data into the cells $520_0$-$520_n$, program information may be stored temporarily on the capacitive storage elements 560 and 570, thus allowing for concurrent program operations to take place within the memory chains 501 and 502. In an embodiment each of the capacitive storage elements 560 and 570 is made up of one or more parasitic capacitances of the bit line segments $580_1$-$580_2$ and $580_2$-$580_3$, respectively. For example, the capacitive storage element 560 may be a combination of parasitic capacitances from the segmenting transistors $580_1$-$580_2$ and the bit line select transistor 540 from the memory chain 502. Thus, the overall capacitance of the capacitive storage element 560 depends on the number of memory chains coupled to the bit line segment $580_1$-$580_2$. In alternative embodiments, however, additional circuit elements (e.g. capacitors) may be coupled to the bit line segments $580_1$-$580_2$ and $580_2$-$580_3$ to increase the overall capacitance of the capacitive storage elements 560 and 570, respectively.

Still referring to the embodiment of FIG. 5, concurrent program operations may be performed within the memory chains 501 and 502 by first applying a low voltage to the bit line BL and charging the capacitive storage element 560 to the appropriate voltage level (note that this requires the segmenting transistors $580_2$ and $580_3$ to be turned on). Once the capacitive storage element 560 is charged to the proper voltage level the segmenting transistor $580_2$ is turned off, thus trapping the stored charge on the capacitive storage element 560. At this time the bit line select transistor 540 is turned on and a program voltage $V_{PGM}$ is applied to one of the word lines $WL_{m+1}$-$WL_n$, while a pass voltage $V_{PASS}$ is applied to the remaining word lines. Also during this time, respective program information may be stored across the capacitive storage element 570. Thus, the bit line select transistor 510 is turned on and a program voltage $V_{PGM}$ is applied to one of the word lines $WL_0$-$WL_m$, while a pass voltage $V_{PASS}$ is applied to the remaining word lines. This allows a second program operation to take place, concurrently, within the memory chain 501 without affecting a first program operation already taking place within memory chain 502. Data may be read from the memory device 500 in a conventional manner, as discussed above in reference to FIGS. 1A and 1B. However, this may require turning on all of the segmenting transistors $580_1$-$580_3$, during a read operation, in order to allow current to flow freely along the segmented bit line BL.

Because program information is stored temporarily on the capacitive storage elements 560 and 570 (i.e. in the bit line segments $580_1$-$580_2$ and $580_2$-$580_3$), a write refresh cycle may be performed directly from the capacitive storage elements 560 and 570 rather than an external RAM. This way, the write refresh cycle will not interrupt any write cycle that may currently be taking place. In alternative embodiments, program data may still be refreshed from the external RAM. For example, this may be desirable if the capacitance of the bit line segments $580_1$-$580_2$ and $580_2$-$580_3$ does not satisfy a program time constraint.

Figure 6:
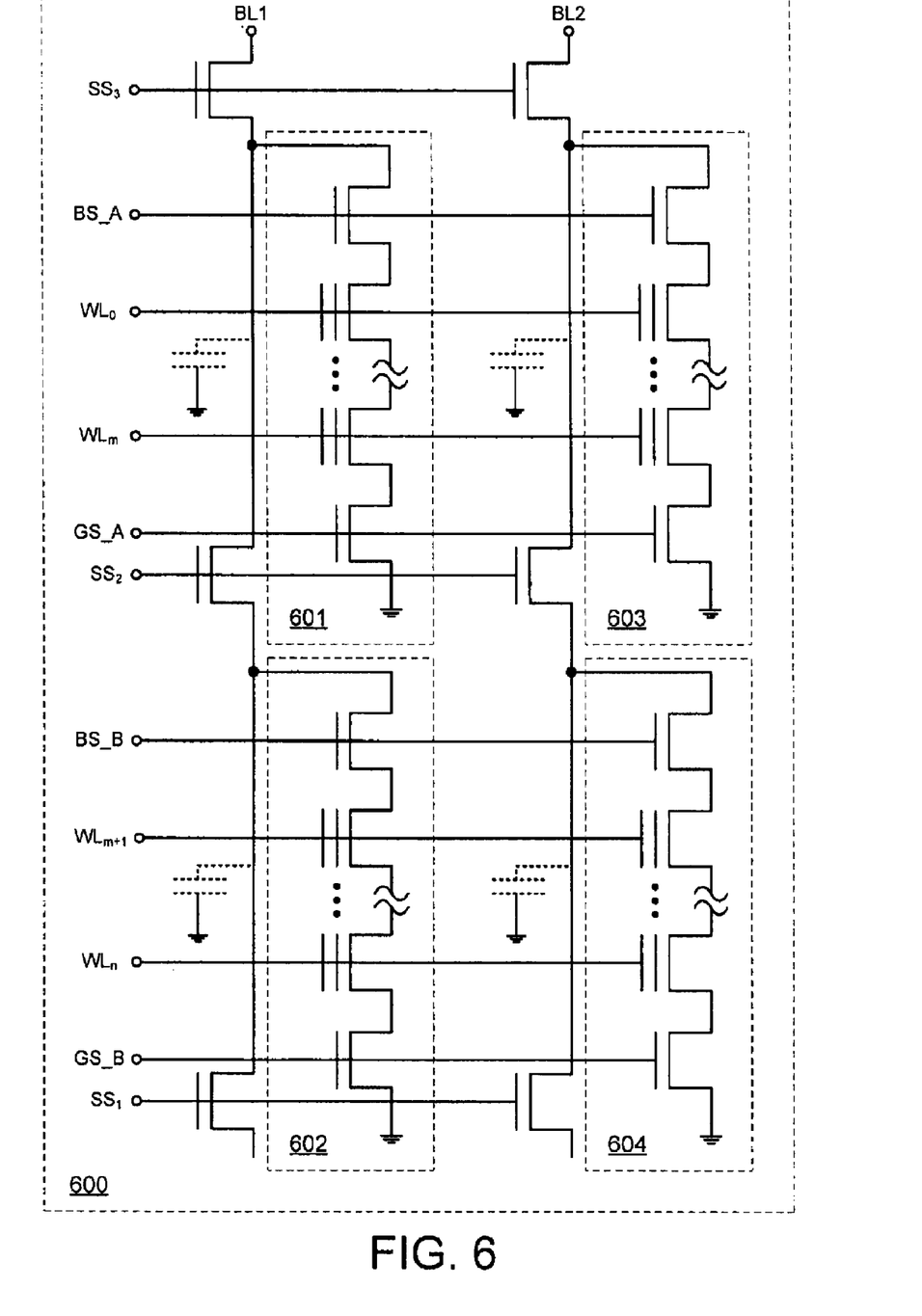
FIG. 6 illustrates a memory device according to another embodiment.

FIG. 6 illustrates a memory device according to another embodiment. Memory device 600 includes two segmented bit lines BL1 and BL2 coupled to four memory chains 601-604. The embodiment of FIG. 6 allows for a program operation to occur in separate pages of each of the bit lines BL1 and BL2, concurrently. For example a first program operation may be performed within the memory chain 602 by applying a low voltage across the first bit line BL1 and applying a high voltage across the second bit line BL2 (note that a high voltage is generally applied to the segment select lines $SS_2$ and $SS_3$ during this time). Thus, when a program voltage $V_{PGM}$ is applied to one of the word lines $WL_{m+1}$-$WL_n$, a bit may be programmed into a corresponding cell of memory chain 602 while all of the data stored within memory chain 604 remains unaffected. A low voltage is then applied across segment select line $SS_2$ to turn off respective segmenting transistors of both bit lines BL1 and BL2 that are coupled to the segment select line $SS_2$. Now a second program operation may be performed within the memory chain 603 by applying a low voltage across the second bit line BL2 and applying a high voltage across the first bit line BL1. This way, when a program voltage $V_{PGM}$ is applied to one of the word lines $WL_0$-$WL_n$, a bit may be programmed into a corresponding cell of memory chain 603 while all of the data stored within memory chain 601 remains unaffected. Thus, a second program operation may take place, concurrently, on the second bit line BL2 without affecting a first program operation already taking place in a different page on the first bit line BL1. In alternative embodiments, a plurality of memory chains may be coupled to each bit line segment of the segmented bit lines BL1 and BL2.

Referring back the embodiment of FIG. 5, the memory device 500 is advantageous in many ways. The first advantage of the memory device 500 is that the bit lines in some cases are shorter than the others which allow faster operations. If the switch $580_2$ is turned off then the bit lines are lightly loaded with capacitive element 570. This lightly loaded condition allows for faster operation compared with the condition when $580_2$ is turned on and $580_1$ is turned off. This condition introduces doubling of the bit line capacitance load by having capacitive elements 570 and 560 on the entire bit line.

The second advantage of memory device 500 being that programmed data may be easily verified for single level cell (SLC) NAND flash devices. For example, after completing a first phase of a write cycle, program information is still retained within the capacitive storage elements 560 and 570 of the bit line segments $580_1$-$580_2$ and $580_2$-$580_3$, respectively. This data may then be read out from each of the capacitive storage elements 560 and 570 along with respective cell data. Thus, the data read out from each of the capacitive storage elements 560 and 570 may be compared with the data read out from a respective cell (i.e. the cell that was programmed during the first phase of the write cycle) to generate new verified read data. These verified read data may then be used for a subsequent phase of the write cycle. For example, the verified read data may be temporarily stored in an external RAM for later use, if necessary. In an embodiment, the loading of data from the external RAM may be pipelined, allowing for faster load times.

Note that the data from the capacitive storage elements 560 and 570 should be read out in the opposite order from which they were programmed (i.e. beginning with the capacitive storage element that is nearest to a page buffer). Thus, program information from the capacitive storage element 570 is read out first, followed by data in one of the cells $520_0$-$520_m$. Program information from the capacitive storage element 560 is read out next, followed by data in one of the cells $520_{m+1}$-$520_n$. Reading data from bit line segments located closer to the page buffer has an added advantage, as such data may be read out faster due to lighter capacitive loading. This improves the average speed at which data is read from the bit line segments as well as the average speed at which data is read out of the cells $520_0$-$520_n$.

Figure 7:
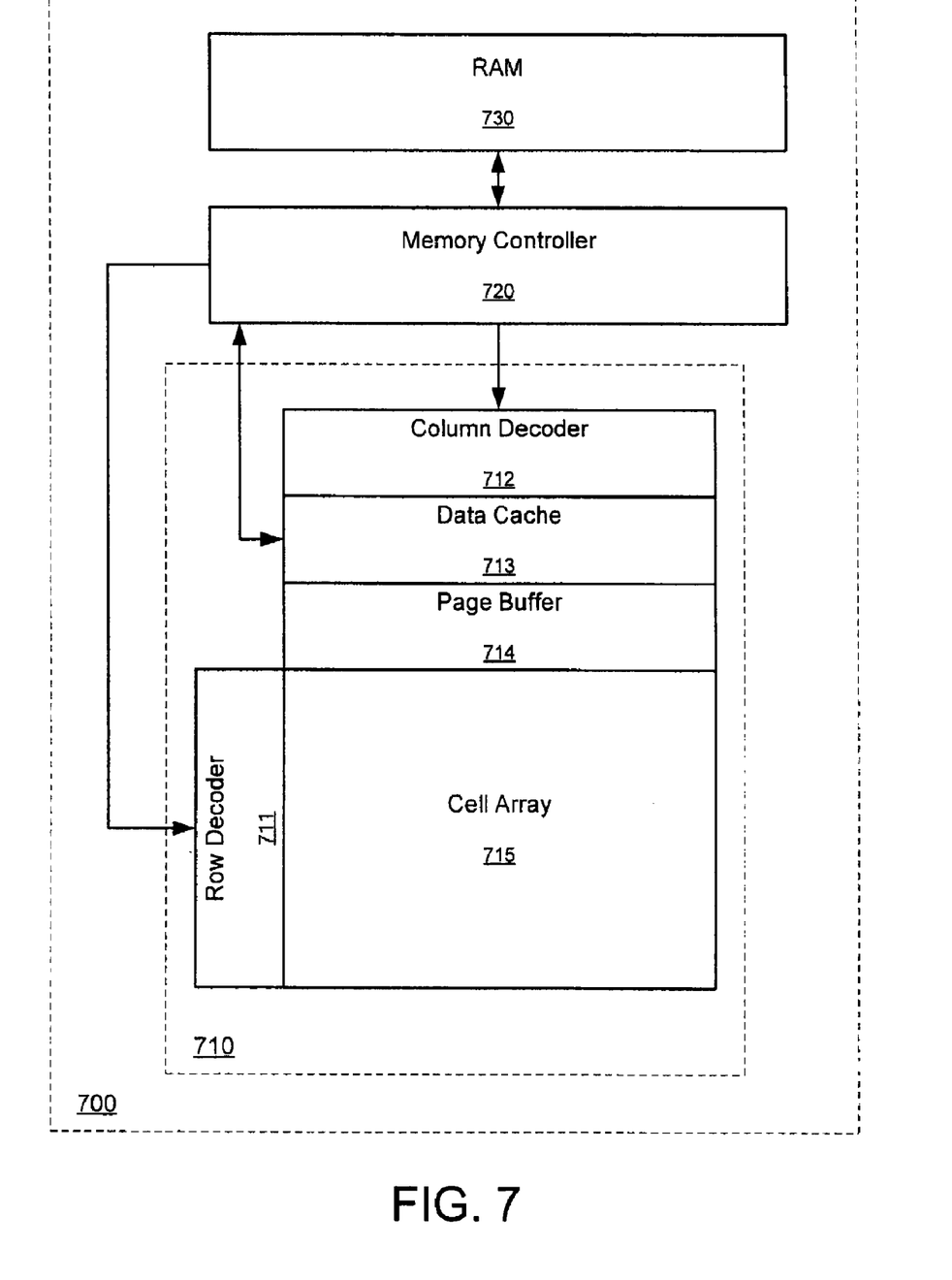
FIG. 7 illustrates a memory system according to an embodiment.

FIG. 7 illustrates a memory system according to an embodiment. The memory system 700 includes a memory device 710, a memory controller 720, and an external RAM 730. The memory device 710 further includes a row decoder 711, a column decoder 712, a data cache 713, a page buffer 714, and a cell array 715. In an embodiment, the cell array 715 is made up of a plurality of word lines and bit lines coupled to storage cells. The row decoder 711 and the column decoder 712 are provided for selecting word lines and bit lines, respectively, within the memory array 715. The page buffer 714 communicates data between the cell array 715. For example, the page buffer 714 is provided for driving program information onto the bit lines during a program operation and sensing a page of data from the bit lines during a read operation.

The memory controller 720 controls program, read, and erase operations within the memory device 710, and may also facilitate the elimination of bad blacks of data and correct bit errors. In an embodiment, the memory controller 720 controls the concurrent activation (e.g. application of a program voltage $V_{PGM}$) of multiple word lines. In another embodiment, the memory controller 720 utilizes the external RAM 730 to buffer program data. For example, the memory controller 720 may maintain a buffer level for the external RAM 730 by writing data into the memory device 710 only when the data loaded into the external RAM 730 exceeds a queue threshold level. In another embodiment, the memory controller 720 tracks active program sections within the memory device 710 to avoid conflicts in multiple page programming in a section. In an alternative embodiment, the memory controller 720 may track the erased blocks of data that are available for programming. In yet another embodiment, the memory controller 720 may track the number of program and erase cycles for each block of data. For example, the memory controller 720 may prioritize the least used blocks for a subsequent program operation. Accordingly, the logic blocks within the memory controller 720 complement the storage elements and state machines within the memory device 710.

Figure 8:
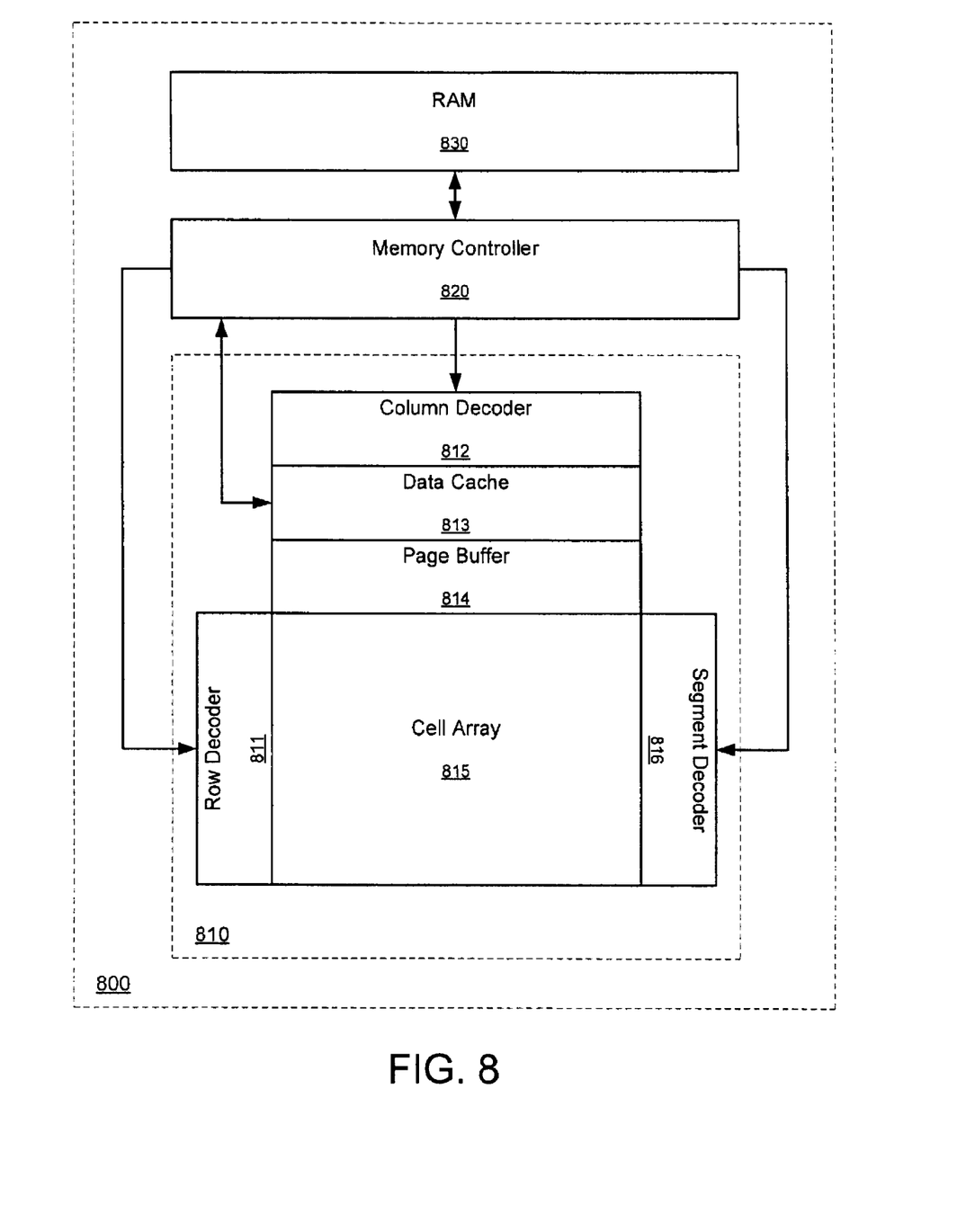
FIG. 8 illustrates a memory system according to another embodiment.

FIG. 8 illustrates a memory system according to another embodiment. The memory system 800 includes a memory device 810, a memory controller 820, and an external RAM 830. The memory device 810 also includes a row decoder 811, a column decoder 812, ad data cache 813, a page buffer 814, a cell array 815, and a segment decoder 816. In an embodiment, the cell array 815 is made up of a plurality of word lines and segmented bit lines coupled to storage cells. The row decoder 811 and the column decoder 812 are provided for selecting word lines and segmented bit lines, respectively, within the memory array 815. The segment decoder 816 is provided for activating one or more segmenting transistors coupled along the segmented bit lines of the cell array 815. The page buffer 814 communicates data between the cell array 815. For example, the page buffer 814 is responsible for driving program information onto the segmented bit lines during a program operation, and sensing a page of data from the segmented bit lines during a read operation.

The memory controller 820 controls program, read, and erase operations within the memory device 810, and may also facilitate the elimination of bad blacks of data and correct bit errors. In an embodiment, the memory controller 820 controls the concurrent activation (e.g. application of a program voltage $V_{PGM}$) of multiple word lines. In another embodiment, the memory controller 820 utilizes the external RAM 830 to buffer program data. For example, the memory controller 820 may maintain a buffer level for the external RAM 830 by writing data into the memory device 810 only when the data loaded into the external RAM 830 exceeds a queue threshold level. In another embodiment, the memory controller 820 tracks active program sections within the memory device 810 to avoid conflicts in multiple page programming in a section. In yet another embodiment, the memory controller 820 controls a sequential programming of pages within the memory device 810. For example, the memory controller 820 ensures that program information is driven onto the bit line segments in sequential order, beginning with the bit line segment furthest away from the page buffer 814, and that stored data is read (and verified) from the bit line segments in the opposite order (i.e. beginning with the bit line segment nearest the page buffer 814). Accordingly, the logic blocks within the memory controller 820 complement the storage elements and state machines within the memory device 810.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A NAND flash memory device comprising:
    a first segmented bit line including a first bit line segment and a second bit line segment;
    a first plurality of storage cells including a first storage cell coupled to the first bit line segment and a second storage cell coupled to the second bit line segment; and
    programming circuitry including a first capacitive circuit coupled to the first bit line segment and a second capacitive circuit coupled to the second bit line segment to program the first storage cell and the second storage cell concurrently.

2. The memory device of claim 1 further comprising a first segmenting transistor coupled between the first bit line segment and the second bit line segment.

3. The memory device of claim 1 wherein each of the first and second capacitive circuits is responsive to activation of respective select signals to receive program information, and operative in response to deactivation of the select signals to apply the received program information to the respective first and second storage cells.

4. The memory device of claim 1 wherein the programming circuitry comprises one or more parasitic capacitances of each of the first and second bit line segments.

5. The memory device of claim 4 wherein one or more parasitic capacitances of the first bit line segment includes a first parasitic capacitance of the first segmenting transistor, and wherein one or more parasitic capacitances of the second bit line segment includes a second parasitic capacitance of the first segmenting transistor.

6. The memory device of claim 1 further comprising:
    a second segmented bit line including a third bit line segment and a fourth bit line segment;
    a second plurality of storage cells including a third storage cell coupled to the third bit line segment and a fourth storage cell coupled to the fourth bit line segment;
    a second segmenting transistor coupled between the third bit line segment and the fourth bit line segment;
    a first word line coupled to the first storage cell and the third storage cell; and
    a second word line coupled to the second storage cell and the fourth storage cell.

7. The memory device of claim 6 wherein the programming circuitry comprises a third capacitive circuit coupled to the third bit line segment and a fourth capacitive circuit coupled to the fourth bit line segment, the programming circuitry to program the first and the fourth storage cells concurrently.

8. The memory device of claim 6 wherein the programming circuitry comprises circuitry to program the second and the third storage cells concurrently.

9. A method of operation comprising:
    activating a first storage cell in response to asserting a first select signal, the first storage cell in a first chain of storage cells coupled to a bit line within a NAND flash memory device;
    activating a second storage cell in response to asserting a second select signal, the second storage cell in a second chain of storage cells coupled to the bit line;
    programming the second storage cell concurrently with programming the first storage cell;
    deasserting the first select signal, and wherein asserting the second select signal occurs after deasserting the first select signal;
    storing a first program information on a first capacitive storage element in response to the first select signal; and
    storing a second program information on a second capacitive storage element in response to the second select signal.

10. The method of claim 9 wherein programming the first storage cell comprises writing the first program information from the first capacitive storage element to the first storage cell, and wherein programming the second storage cell comprises writing the second program information from the second capacitive storage element to the second storage cell.

11. The method of claim 10 further comprising:
    refreshing the first program information stored in the first storage cell from the first capacitive storage element; and
    refreshing the second program information stored in the second storage cell from the second capacitive storage element.

12. The method of claim 10 further comprising:
    verifying data written to the first storage cell based on the first program information stored in the first capacitive storage element; and
    verifying data written to the second storage cell based on the second program information stored in the second capacitive storage element.

13. The memory device of claim 1 wherein the capacitive circuits comprise first and second capacitive storage elements coupled to the first and second bit line segments, respectively.

* * * * *